United States Patent
Masai et al.

(10) Patent No.: US 8,956,547 B2
(45) Date of Patent: Feb. 17, 2015

(54) PIEZOELECTRIC COMPOSITION AND PIEZOELECTRIC ELEMENT

(71) Applicant: TDK Corporation, Tokyo (JP)

(72) Inventors: Taku Masai, Tokyo (JP); Masahito Furukawa, Tokyo (JP)

(73) Assignee: TDK Corporation, Tokyo (JP)

( * ) Notice: Subject to any disclaimer, the term of this patent is extended or adjusted under 35 U.S.C. 154(b) by 0 days.

(21) Appl. No.: 13/755,354

(22) Filed: Jan. 31, 2013

(65) Prior Publication Data

US 2013/0193367 A1 Aug. 1, 2013

(30) Foreign Application Priority Data

Jan. 31, 2012 (JP) ................. 2012-018572
Nov. 21, 2012 (JP) ................. 2012-255162

(51) Int. Cl.
| | |
|---|---|
| C04B 35/00 | (2006.01) |
| H01L 41/00 | (2013.01) |
| H01L 41/187 | (2006.01) |
| C04B 35/475 | (2006.01) |
| C04B 35/626 | (2006.01) |
| H01L 41/316 | (2013.01) |

(52) U.S. Cl.
CPC .......... *H01L 41/1873* (2013.01); *C04B 35/475* (2013.01); *H01L 41/187* (2013.01); *C04B 35/62675* (2013.01); *H01L 41/316* (2013.01); *C04B 2235/3201* (2013.01); *C04B 2235/3241* (2013.01); *C04B 2235/3262* (2013.01); *C04B 2235/3272* (2013.01); *C04B 2235/3275* (2013.01); *C04B 2235/3298* (2013.01); *C04B 2235/6562* (2013.01); *C04B 2235/6565* (2013.01); *C04B 2235/768* (2013.01); *C04B 2235/785* (2013.01); *C04B 2235/786* (2013.01)
USPC .................................. 252/62.9 PZ; 310/311

(58) Field of Classification Search
USPC ........ 252/62.9 PZ, 62.9 R; 501/134; 310/311
See application file for complete search history.

(56) References Cited

FOREIGN PATENT DOCUMENTS

| | | | |
|---|---|---|---|
| CN | 101234895 A | * | 8/2008 |
| JP | 2004075449 A | * | 3/2004 |
| JP | A-2004-75449 | | 3/2004 |
| JP | B2-4177615 | | 11/2008 |

OTHER PUBLICATIONS

Joshi, "Synthesis of Bi0.5Na0.5TiO3-BiFeO3 solid solution via Combustion Synthesis Route", May 13, 2009, Department of Ceramic Engineering, National Institue of Technology Roukela, abstract and pp. iii, 1, 16 and 19-27.*
Machine translation of CN101234895A.*
Extended European Search Report issued in European Patent Application No. 13153516.3 dated Jun. 3, 2013.

* cited by examiner

*Primary Examiner* — Carol M Koslow
*Assistant Examiner* — Lynne Edmondson
(74) *Attorney, Agent, or Firm* — Oliff PLC

(57) ABSTRACT

A piezoelectric compound having no occurrence of segregation or uneven structures as well as a piezoelectric element having excellent piezoelectric properties. The piezoelectric composition includes a main component that is a perovskite-typed oxide represented by formula of $ABO_3$, wherein, one site includes Bi, Na, and another site includes Ti, and part of the Ti is substituted by transition metal element Me (Me is at least one element selected from the group consisting of Mn, Cr, Fe and Co), according to the conversion of $BiMeO_3$, the content ratio of Bi and the transition metal element Me accounts for 6~43 mol % relative to the whole perovskite-typed oxides as the main component.

2 Claims, 2 Drawing Sheets

PIEZOELECTRIC COMPOSITION AND PIEZOELECTRIC ELEMENT

FIELD OF INVENTION

The present invention relates to a piezoelectric composition and a piezoelectric element widely used in fields such as the piezoelectric sounders, piezoelectric sensors, piezoelectric actuators, piezoelectric transformers or piezoelectric ultrasonic motors.

BACKGROUND

A piezoelectric composition, which is widely used recently in a variety of fields, has the effect of generating a distortion by an external electrical field being applied (electrical energy being converted to mechanical energy) and the effect of generating charges on the surface by an external stress being applied (the mechanical energy being converted to electrical energy). For example, piezoelectric compositions such as lead zirconate titanate (Pb(Zr,Ti)$O_3$: PZT) will be distorted substantially in proportion to the applied voltage with a degree of $1 \times 10^{-10}$ m/V, leading to the excellent performance in fine position adjustment and etc., and such compositions can be further used for fine adjustment in optical system. On the contrary, a piezoelectric composition will generate charges in proportion to the applied stress or the deformation caused by the stress and thus can be employed as a sensor for detecting minute forces or deformations. Furthermore, as piezoelectric compositions have excellent response capacity, they themselves or elastomer having joint relationship with them will be activated by applying an alternating-current field, leading to resonance. Thus, a piezoelectric composition can be used as piezoelectric transformers, piezoelectric motors and etc.

Currently, most of the piezoelectric compositions in use are solid solutions formed of PbZr$O_3$(PZ)—PbTi$O_3$(PT)(PZT). Piezoelectric compositions meeting various requirements can be developed by adding various accessory ingredients or additives to PZT-based piezoelectric compositions. For example, a piezoelectric composition used in actuators or the like for position adjustment can be developed that the composition has a low mechanical quality factor (Qm) and a high piezoelectric constant (d) and can obtain a large displacement under direct current (DC). Also, a piezoelectric composition having a low piezoelectric constant (d) and a large mechanical quality factor (Qm) can be developed to be used in ultrasonic wave-generating elements such as ultrasonic motors under alternative current (AC).

There are substances other than PZT that can be used as the piezoelectric compositions, most of which are solid solutions using lead-based perovskites such as lead magnesium niobium oxide (Pb(Mg,Nb)$O_3$: PMN) as the main component.

However, these lead-based piezoelectric compositions contain large amount of about 60-70 mass % of lead oxides as the main component which have an extremely high volatility even at low temperatures. For example, in PZT or PMN, lead oxides account for about 2/3 by mass ratio. Thus, during the preparation of these piezoelectric compositions, a extremely large quantity of lead oxides are volatilized and diffused into the atmosphere in the thermal treatment process such as the firing process in the case of piezoelectric ceramics or the melting process in the case of piezoelectric single crystals. As for the lead oxides released during the preparation, although they can be retrieved, the lead oxides contained in piezoelectric products circulated in market as industrial products are hard to be recovered for now. If these industrial products are left in the environment, problems are to be concerned such as lead release caused by acid rain. In this respect, lead-free piezoelectric compositions will become an extremely important issue if the piezoelectric ceramics and piezoelectric single crystals are to be applied to more wide fields and to be used in more amounts.

As a lead-free piezoelectric composition, for example, barium titanate (BaTi$O_3$), bismuth layered ferroelectric and etc. are well known. However, barium titanate has a curie point as low as 120° C. As the piezoelectric property will disappear at a temperature of 120° C. or higher, it is not practical if the use of joint by welding or vehicles is considered. In addition, bismuth layered ferroelectric has a curie point of 400° C. or higher as well as excellent thermal stability. However, because of the large anisotropy, it is necessary to induce spontaneous polarization by hot forging etc., leading to the problem at productivity. Also, it is hard to get piezoelectric property if completely no lead is contained.

Recently, a sodium bismuth titanate-based composition is being studied as a new piezoelectric composition. For instance, Patent Document 1 has disclosed a composition comprising sodium bismuth titanate or barium titanate.

DOCUMENTS OF PRIOR ART

Patent Documents

Patent document 1: JP4177615

SUMMARY OF THE INVENTION

Problem to be Solved

Compared to the lead-based piezoelectric compositions, sodium bismuth titanate-based compositions are not capable of obtaining sufficient piezoelectric properties especially those concerning spontaneous polarization or the piezoelectric constant. Thus, the piezoelectric properties have to be further improved.

The piezoelectric ceramics disclosed in Patent Document 1 use perovskite-typed composite oxides represented by the general formula of AB$O_3$ as the main component, wherein A in the formula represents one or more elements selected from the group consisting of Bi, Na, K and Ba. Further, B in the formula is composed of Ti and part of the B(=Ti) is substituted by trivalent element M (III) to obtain the perovskite-typed composite oxides. However, as Ti in site B is tetravalent, the imbalance of charge balance occurs due to the element substitutions, leading to the insufficient electrical characteristics.

Besides, in the method of Patent Document 1, the amount of Bi at A site will not change even the addition amount of trivalent element M (III) is increased, causing the deliquescence of remaining alkali metals at site A. Thus, heterogeneous phases may occur as the temperature of sintering changes.

Generally speaking, during the firing of a Bi-based perovskite composition, the grains are likely to grow into abnormal ones, leading to an uneven structure in which grains of more than 100 microns are mixed with fine grains of several microns. The structure is hard to be controlled.

If some other elements are added to improve the piezoelectric properties, the constituent elements from the perovskite structure will react with the added oxides, and the second phase increases, polarization becomes difficult as the result.

In view of the above, the present invention has studied the composition of sodium bismuth titanate by controlling the amount of Bi to be added based on the substitution at site B, wherein segregation (a second phase is contained) or uneven structures will not occur in the sodium bismuth titanate. Further, by preparing a lead-free compound, the present invention is aimed to provide a piezoelectric composition and a piezoelectric element that is excellent from the view of low pollutions, environment resistance and ecology.

Solutions to the Problem

In order to solve the above-mentioned problem, the inventors of the present invention have used the sodium bismuth titanate-based composition to test the piezoelectric composition exhibiting good piezoelectric properties and having no segregation or uneven structures. Then, they have found a piezoelectric composition having different composition from the current ones.

The first piezoelectric composition of the present invention is characterized in that the main component is a perovskite-typed oxide represented by the formula of $ABO_3$, wherein, A site comprises Bi, Na, B site comprises Ti and part of the Ti is substituted by transition metal element Me (Me is at least one element selected from the group consisting of Mn, Cr, Fe and Co). Further, according to the conversion of $BiMeO_3$, the content ratio of Bi and transition metal element Me accounts for 6-43 mol % relative to the whole perovskite-typed oxides as the main component. In the present invention, in order to ensure the evenness of charge balance when the substitution at site B is performed, it is preferably to add the same amount of Bi relative to Me in molar ratio.

In this way, the deliquescence of remaining alkali metals at site A or the unevenness of charge balance at site B can be inhibited. Further, Bi with a low melting point can decrease the whole sintering temperature so that the occurrence of heterogeneous phases can be inhibited. Thus, excellent piezoelectric properties are obtained.

The second piezoelectric composition of the present invention is a two component-based solid solution represented by formula 1:

$$(1-x)(Bi_{0.5}Na_{0.5})TiO_3-xBiMeO_3 \qquad (1),$$

wherein, the range of x is $0.06 \le x \le 0.43$, and transition metal element Me is at least one element selected from the group consisting of Mn, Cr, Fe or Co.

The $BiMeO_3$ in formula (1) obtains the charge balance in a form of the chemical compound. Thus, relative to the transition metal Me, the same amount of Bi in molar ratio is added, which would inhibit the deliquescence of remaining alkali metals at site A and the unevenness of charge balance at site B. In this way, an excellent piezoelectric property is obtained as the result. If the range of x in formula 1 is $0.06 \le x \le 0.43$, more excellent piezoelectric property is obtained.

Furthermore, the transition metal element Me contained in the piezoelectric composition represented by formula 1 is at least one element selected from the group consisting of Mn, Cr, Fe and Co. If the transition metal element Me is used, the local existence of electrons is improved because the electron movement is restricted to certain orbits. Also, the coulomb interaction among electrons might reach somewhere far away due to the incompleteness of shield of coulomb potential. As the coulomb interaction formed between the ion at site A and the ion at site B is elevated and the symmetry of coulomb potentials is decreased, $BiMeO_3$ can have a crystal structure of any one of a rhombohedral-typed perovskite and a tetragonal-typed perovskite.

The piezoelectric composition of the present invention is characterized by using the above-mentioned $(Bi_{0.5}Na_{0.5})$ $TiO_3$ and $BiMeO_3$ as the main components, wherein $(Bi_{0.5}Na_{0.5})TiO_3$ has a rhombohedral-perovskite-typed structure, and $BiMeO_3$ has either a rhombohedral-perovskite-typed structure or a tetragonal-perovskite-typed structure. Similar to PZT-based piezoelectric compositions, the piezoelectric composition of the present invention has excellent piezoelectric properties because of the composition close to the Morphotropic Phase Boundary in crystallography of $(Bi_{0.5}Na_{0.5})TiO_3$ of rhombohedral-typed structure and $BiMeO_3$ belonged to crystal system of either rhombohedral-perovskite-typed structure or a tetragonal-perovskite-typed structure.

Further, to use the perovskite-typed oxide of formula 1 as the main component means that other components such as potassium or barium can be contained if the characteristics of the mentioned piezoelectric composition will not be impaired.

Further, a piezoelectric element with excellent piezoelectric property can be prepared by using the piezoelectric composition of the present invention.

Effects of Invention

The piezoelectric composition of the present invention can suppress the deliquescence of remaining alkali metals at site A and the unevenness of charge balance at site B by adjusting the amount of Bi to be added. Also, the composition can prevent the heterogeneous phases from happening because of the low melting point due to the addition of Bi. Further, a piezoelectric composition having piezoelectric properties such as spontaneous polarization can be provided as well as a piezoelectric element having excellent piezoelectric properties since a second compound $BiMeO_3$ is contained which is belonged to any crystal system of a rhombohedral-perovskite-typed structure and a tetragonal-perovskite-typed structure.

Also, the lead-free composition of the present invention provides an extremely excellent piezoelectric composition and an excellent piezoelectric element using the piezoelectric composition from the view of low pollutions, environment resistance and ecology.

BRIEF DESCRIPTION OF THE ACCOMPANYING DRAWINGS

Figure 1:
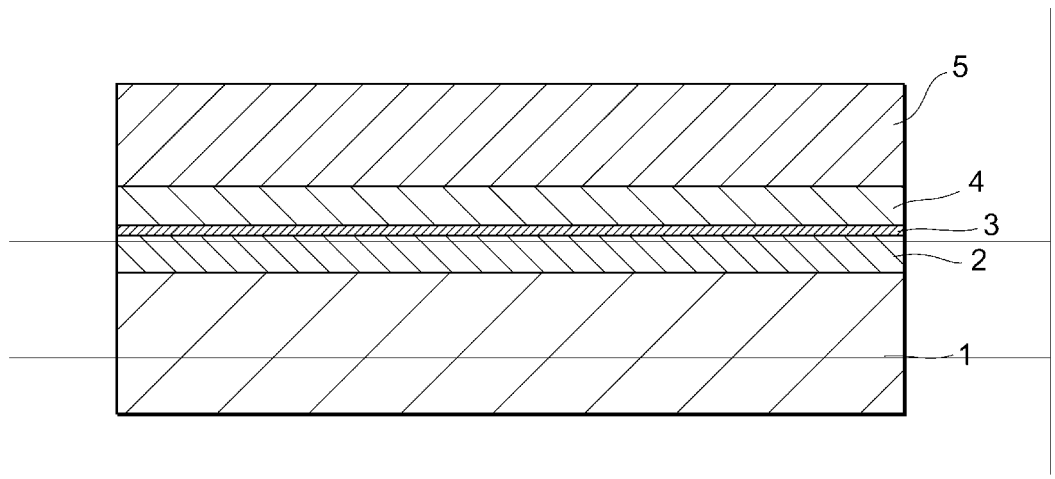
FIG. 1 is a sectional schema chart of a piezoelectric film element.

1. Si substrate
2. Thermal oxidation film
3. Ti adhesive layer
4. Lower electrode
5. Piezoelectric film
6. Upper electrode

DETAILED DESCRIPTION OF THE INVENTION

The embodiments of the present invention will be described in detail below.

The piezoelectric composition of Embodiment 1 of the present invention is characterized in that the main component is a perovskite-typed oxide represented by the formula of $ABO_3$, wherein, A site comprises Bi, Na, B site comprises Ti and part of the Ti is substituted by transition metal element Me (Me is at least one element selected from the group consisting of Mn, Cr, Fe and Co). Further, according to the conversion of BiMeO$_3$, the content ratio of Bi and transition metal element Me accounts for 6-43 mol % relative to the whole perovskite-typed oxides as the main component.

The piezoelectric composition with the above composition has excellent piezoelectric properties due to the capacity of inhibiting the segregation (a second phase is contained) and uneven structures.

The piezoelectric composition of Embodiment 2 of the present invention is a two component-based solid solution represented by formula 1:

$$(1-x)(Bi_{0.5}Na_{0.5})TiO_3\text{-}xBiMeO_3 \quad (1),$$

wherein, the range of x is 0.06≤x≤0.43, and the transition metal element Me is at least one element selected from the group consisting of Mn, Cr, Fe or Co.

The piezoelectric composition of the above Embodiment 2 comprises a first compound of a rhombohedral-perovskite-typed structure and a second compound (BiMeO$_3$) of either a rhombohedral-perovskite-typed structure or a tetragonal-perovskite-typed structure. These compounds can also be formed deviating from the stoichiometric ratio.

The perovskite-typed oxide of formula 1 is a solid solution containing a first compound of a rhombohedral-perovskite-typed structure and a second compound of either a rhombohedral-perovskite-typed structure or a tetragonal-perovskite-typed structure. Thus, Morphotropic Phase Boundary in crystallography is at least formed on part of the piezoelectric composition, and the piezoelectric property of the composition is improved accordingly. Specifically, compared to the chemical compound of sodium bismuth titanate, properties such as piezoelectric constant and spontaneous polarization are improved.

As the first compound in formula 1, for example, sodium bismuth titanate is exemplified. The composition of sodium bismuth titanate is represented by the following formula 2, wherein sodium and bismuth are located at site A of the perovskite-typed structure and titanium is located at site B of the perovskite-typed structure.

$$(Bi_{0.5}Na_{0.5})_{s1}TiO_3 \quad (2)$$

In formula 2, s1 represents the composition ratio caused by molar ratio of elements located at site A relative to elements located at site B (Hereinafter referred to as A/B ratio), and will be 1 in the case of the stoichiometric composition, and also can deviate the stoichiometric composition. The s1 is preferred to be 1 or less because the sintering property can be improved and a higher piezoelectric property can be obtained. The s1 is more preferably to be within the range of 0.9 or more and 1.0 or less as a higher piezoelectric property can be obtained.

As the second compound, for example, cobalt bismuth oxide is exemplified. The composition of cobalt bismuth oxide is represented by the following formula 3, wherein bismuth is located at site A of the perovskite-typed structure and cobalt is located at site B of the perovskite-typed structure.

$$Bi_{t1}CoO_3 \quad (3)$$

In formula 3, t1 represents the A/B ratio, and will be 1 in the case of the stoichiometric composition, and also can deviate the stoichiometric composition. The t1 is preferred to be 1 or less because the sintering property can be improved and a higher piezoelectric property can be obtained. The t1 is more preferably to be within the range of 0.9 or more and 1.0 or less as a higher piezoelectric property can be obtained.

Similar to the first compound, the second compound can either be constituted of one kind of element at site B, or be constituted of multiple kinds of elements at site B. When composed of multiple kinds of compounds, the ratio of the number of elements at site A and that at site B (i.e., A/B ratio) in each compound can be 1 in the case of stoichiometric composition, and also can deviate 1. The NB ratio is preferred to be 1 or less, and is more preferred to be within the range of 0.9 or more and 1.0 or less.

When the first compound and the second compound are mixed at a certain ratio, it is represented as the following formula 4.

$$(1-x)(Bi_{0.5}Na_{0.5})TiO_3\text{-}xBiMeO_3 \quad (4)$$

$$0.06 \leq x \leq 0.43 \quad (5)$$

In formula 4, respectively, (1−x) represents the molar ratio of the first compound and x represents the molar ratio of the second compound, and x falls within the range defined in formula 5.

If x is outside the above range, the composition will be far from the Morphotropic Phase Boundary of the first compound of a rhombohedral-perovskite-typed structure and the second compound of either a rhombohedral-perovskite-typed structure or a tetragonal-perovskite-typed structure in crystallography, leading to the degradation of the piezoelectric properties. Here, the "composition ratio" refers to a value of the whole piezoelectric composition comprising both solid solutions and non-solid solutions.

As impurities or constituent elements of other compounds, the present invention can contain elements other than those constituting the first compound and the second compound in the degree of tens to hundreds of ppm. As such elements, for example, barium, strontium, calcium, lithium, hafnium, nickel, tantalum, silicon, boron, aluminum and rare earth elements are exemplified.

The average particle size of the grains of the piezoelectric composition obtained by the above-mentioned method is about 0.5 μm~20 μm.

The piezoelectric composition of the present invention can also contain lead with its preferred amount being 1 mass % or less. More preferably, the piezoelectric composition is completely lead-free. It is preferred for the reason that the volatilization of lead during firing and the release of lead to the environment after circulated and discarded in market as piezoelectric parts are suppressed to the minimum level, from the view of low pollutions, environment resistance and ecology.

The piezoelectric composition with the composition mentioned above can be prepared as follows.

First of all, as the starting materials, powders such as bismuth oxide, sodium carbonate, titanium oxide, ferric oxide, cobalt oxide, copper oxide, chromium oxide, manganese oxide are prepared as required, and sufficiently dried at 100° C. or higher and then weighed in accordance with the target composition. In the starting materials, carbonates or oxalates which will turn to oxides by firing can be used to replace oxides, and oxides or other substances which will turn to oxides by firing can be used to replace carbonates.

Thereafter, the weighed starting materials are sufficiently mixed for 5~20 hours in an organic solvent or water by using a ball mill or the like, then intensively dried, compression molded and treated for calcining for about 1~3 hours at 750~900° C. After the resultant of calcining is milled for 5~30 hours in an organic solvent or water using a ball mill or the like, it is dried again and then granulated with the addition of a binder solution. After granulation, the granulated powders are compression molded and prepared into blocks.

After the blocks is prepared, the molded body is thermal treated for about 2~4 hours at 400-800° C. to volatilize the binders and then sintered for about 2~4 hours at 950-1300° C. The heating rate and the cooling rate during sintering are set to be, for example, about 50° C./hour~300° C./hour. After sintering, the obtained sintered body can be grinded and disposed with electrode(s) therein as required. Then, a polarization treatment is carried out in silicone oil of 25~150° C. by applying an electric field of 5~10 MV/m for 5 minutes-1 hour. In this way, the piezoelectric composition above is obtained.

The preparation method described here is called solid-state reaction method. As the representative method in addition to the solid-state reaction method, vapor-phase growth method is exemplified. The vapor-phase growth method is a process in which the raw materials (target materials) is vaporized in vacuum and a thin film is formed with a thickness ranging from tens of nanometer to several microns on a flat substrate.

The vapor-phase growth method is preferably as sputtering method, evaporation deposition method, pulsed-laser deposition method and etc. By using these methods, a thin film can be formed and segregation and the like will be difficult to occur. These vapor-phase growth methods is to physically vaporize the raw materials (target materials) and deposit them on the substrate, wherein the excitation sources vary according to the film-forming process. Ar plasma in the case of sputtering, electron beam in the case of evaporation deposition and laser light in the case of pulsed-laser deposition are respectively used as excitation sources to irradiate the targets.

The target materials used as the raw materials in film-forming can utilize the sintered body prepared by the above powder metallurgy. When using such vapor-phase growth method, the piezoelectric composition of the present invention is generally formed on a Si substrate or an MgO substrate or a $SrTiO_3$ substrate etc. When the composition is deposited on a Si substrate, the adhesive layer of Ti or Cr or the like is formed into a film, then a Pt lower electrode should be formed into a film. In this way, after the piezoelectric material is deposited on the lower electrode, a required crystal phase will be obtained by applying a post-annealing treatment appropriately. As the methods for obtaining polycrystalline film, there are following ones: the method by heating substrate while allowing the crystals growth; and the method by film-forming at room temperature and then firing at a required temperature to obtain the polycrystalline film.

The piezoelectric composition of the present application is applicable to piezoelectric sounders, piezoelectric sensors, piezoelectric actuators, piezoelectric transformers or piezoelectric ultrasonic motors and etc. This composition can also be used in other apparatuses as long as the apparatus is a piezoelectric element capable of using a piezoelectric composition.

EXAMPLES

The present invention will be more specifically described based on the Examples and Comparative examples but will not be limited to these examples.

Example 1~Example 6

FIG. 1 is a section view of the structure of the piezoelectric film element in the present example. Si substrate 1 with a thermal oxidation film was used as the substrate. The Si substrate 1 was a circular substrate with a diameter of 3 inches. The orientation to plane (100) is constituted of the Si substrate 1 with a thickness of 0.5 mm and the thermal oxidation film 2 formed thereon with a thickness of 500 nm. First of all, a Ti adhesive layer 3 and a lower electrode layer 4 were formed on the substrate by RF magnetron sputtering method. The lower electrode layer 4 was consisted of Ti adhesive layer 3 with a film thickness of 20 nm and Pt lower electrode layer 4 with a film thickness of 200 nm, wherein the Ti adhesive layer 3 was formed on the thermal oxidation film 2, and the Pt lower electrode layer 4 was formed on the Ti adhesive layer 3 and preferably oriented to plane (111). The thickness of the Ti adhesive layer 3 can be properly adjusted as long as it could function as an adhesive layer.

The film-forming conditions of the Ti adhesive layer 3 and Pt lower electrode layer 4 were as follows: the temperature of substrate was room temperature, the output power was 100 W of direct current, the input gas was Ar and the pressure for film-forming was 0.3 Pa.

Thereafter, a piezoelectric film 5 was formed into a film on the Pt lower electrode layer 4. As the film-forming method, the pulsed-laser deposition (hereafter referred to as PLD) was used. The thickness of the piezoelectric film was set to be 500 nm. As the targets of PLD, the sintered bodies of $(Bi_{0.5}Na_{0.5})TiO_3$ and $BiCoO_3$ were used. The rates of film-forming were respectively 0.02 nm/shot and 0.006 nm/shot. The composition ratios showed in Table 1 were set by adjusting the shot numbers. The conditions for film-forming were as follows: the temperature of substrate was room temperature, the power of the laser was 60 mJ, the input gas was $O_2$ and the pressure was $1.33 \times 10^{-3}$ Pa. After film-forming, a thermal treatment was performed for 1 minute at 800° C. under $O_2$ atmosphere. Then, the piezoelectric film of this example was obtained by these methods.

Figure 2:
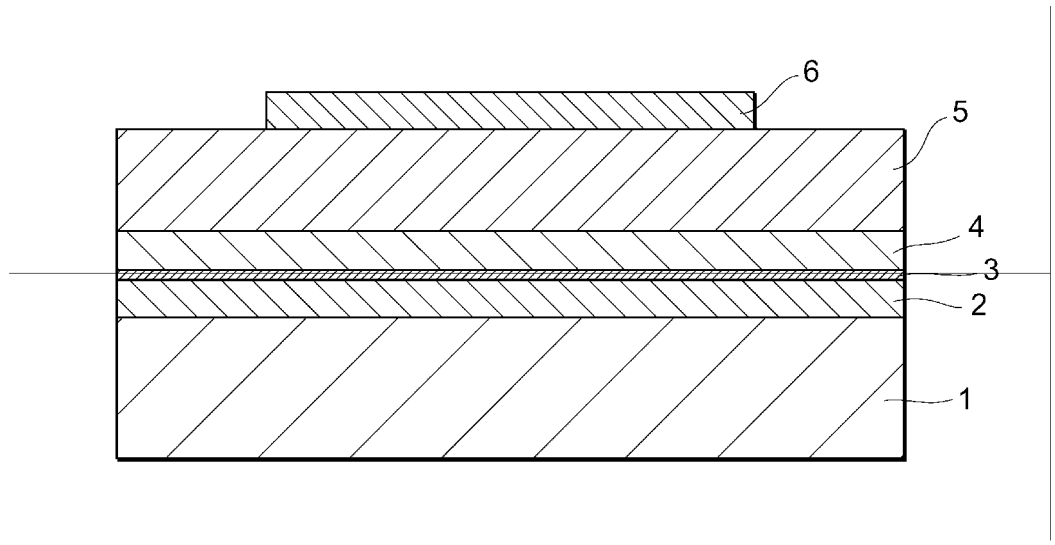
FIG. 2 is a sectional schema chart of a piezoelectric film element for the evaluation of piezoelectric properties.

In order to evaluate the electrical properties of the piezoelectric film 5, as shown in FIG. 2, a Pt with the thickness of 100 nm was formed on the piezoelectric film 5 by RF magnetron sputtering method. The conditions for film-forming were the same as those for the lower electrode. Thereafter, the upper electrode was patterned by photo-etching, etching and etc. so as to form an upper electrode 6 and prepare a piezoelectric film element as shown in FIG. 2 which can be evaluated for electrical properties.

As the evaluation of piezoelectric properties, the measurements of the relative dielectric constant $\in r$ and the maximum amount of polarization P [$uC/cm^2$] were carried out. As the spontaneous polarization value was obtained by multiplying piezoelectric constant [C/N] by stress [$N/cm^2$], the spontaneous polarization value [$C/cm^2$] had to be maximized in order to obtain a high piezoelectric constant. Further, because the piezoelectric constant is proportional to the half power of dielectric constant, the maximum of dielectric constant leads to the maximum of piezoelectric constant, so that the evaluation of the spontaneous polarization value and dielectric constant were carried out.

Examples 7~10

As to Examples 7~10, the piezoelectric film elements were prepared using the same method as in Examples 1-6 except that the PLD targets were respectively replaced with $BiCrO_3$, $BiFeO_3$, $BiMnO_3$ and etc. In Example 10, the rate of film-forming was adjusted so that the ratio of Co and Mn contained was 1:1.

Comparative Examples 1~10

As to Comparative Examples 1~10, the piezoelectric film elements were prepared using the same method as in Examples except that the composition ratio of $(Bi_{0.5}Na_{0.5})TiO_3$ and $BiCoO_3$ was changed.

Comparative Examples 11-13

As to Comparative Examples 11-13, the piezoelectric film elements were prepared using the same method as in Examples 1~6 except that the PLD targets were respectively replaced with $BiCrO_3$, $BiFeO_3$, $BiMnO_3$ and etc. The composition ratio is changed by adjusting the pulse number corresponding to the rate of film-forming.

The evaluation results about the piezoelectric properties of the piezoelectric film elements were shown in Table 1 and FIG. 3 as follows.

TABLE 1

| | Added Elements (Me) | Composition ratio x of $BiMeO_3$ | Composition ratio 1-x of $(Bi_{0.5}Na_{0.5})TiO_3$ | segregation | $P[uC/cm^2]$ | $\epsilon r$ |
|---|---|---|---|---|---|---|
| Comparative Exmaple 1 | Co | 1.00 | 0.00 | None | 1 | 36 |
| Comparative Example 2 | Co | 0.93 | 0.07 | None | 2 | 40 |
| Comparative Example 3 | Co | 0.87 | 0.13 | None | 2 | 46 |
| Comparative Example 4 | Co | 0.80 | 0.20 | None | 2 | 60 |
| Comparative Example 5 | Co | 0.73 | 0.27 | None | 2 | 72 |
| Comparative Example 6 | Co | 0.67 | 0.33 | None | 3 | 104 |
| Comparative Example 7 | Co | 0.60 | 0.40 | None | 4 | 169 |
| Comparative Example 8 | Co | 0.53 | 0.47 | None | 13 | 219 |
| Comparative Example 9 | Co | 0.47 | 0.53 | None | 22 | 325 |
| Comparative Example 10 | Co | 0.00 | 1.00 | None | 22 | 300 |
| Comparative Example 11 | Cr | 0.70 | 0.30 | None | 3 | 51 |
| Comparative Example 12 | Mn | 0.70 | 0.30 | None | 3 | 55 |
| Comparative Example 13 | Fe | 0.70 | 0.30 | None | 3 | 60 |
| Example 1 | Co | 0.40 | 0.60 | None | 31 | 405 |
| Example 2 | Co | 0.33 | 0.67 | None | 33 | 428 |
| Example 3 | Co | 0.27 | 0.73 | None | 33 | 446 |
| Example 4 | Co | 0.20 | 0.80 | None | 28 | 425 |
| Example 5 | Co | 0.13 | 0.87 | None | 28 | 434 |
| Example 6 | Co | 0.07 | 0.93 | None | 25 | 346 |
| Example 7 | Cr | 0.20 | 0.80 | None | 25 | 320 |
| Example 8 | Mn | 0.20 | 0.80 | None | 27 | 340 |
| Example 9 | Fe | 0.20 | 0.80 | None | 30 | 355 |
| Example 10 | Co:Mn = 1:1 | 0.20 | 0.80 | None | 28 | 340 |

The measurement of the relative dielectric constant $\epsilon r$ was carried out by using Semiconductor Device Analyzer (B1500A, Agilent Technologies Co. Ltd.). As the measurement conditions, bias voltage was ±1.5V, measurement frequency was 1 MHz and alternating voltage was 100 mV.

The measurement of the maximum amount of polarization (P) was carried out by using Sawyer Tower circuit with an input frequency of 10 kHz and an applied field of 50 kV/mm.

Figure 3:
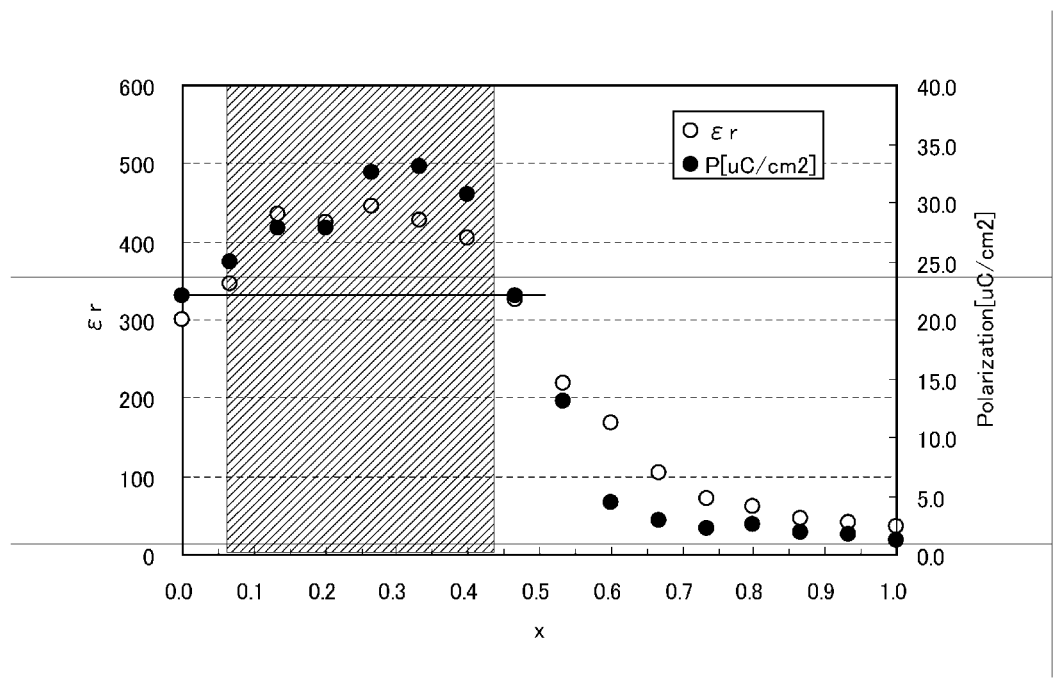
FIG. 3 is a graph showing the relationship between the composition ratio x of cobalt bismuth oxide and the piezoelectric properties.

These results were shown in Table 1 and FIG. 3. FIG. 3 was a graph illustrating the relationship between the composition ratio x of cobalt bismuth oxide ($BiCoO_3$) and the maximum amount of polarization (P) as well as the relationship between x and $\epsilon r$.

As the film-forming process of piezoelectric film, the PLD method was used to be described. However, any method of sputtering method, solution method, CVD (chemical vapor deposition) method and etc. could also be used.

In addition, even if piezoelectric element using the piezoelectric composition was prepared by using solid-state reaction method, the same results were confirmed to be obtained.

As illustrated in Table 1 and FIG. 3, when the range of the composition ratio x of cobalt bismuth oxide was meeting $0.06 \leq x \leq 0.43$, as the composition ratio x of cobalt bismuth oxide being compared with that of Comparative Examples, more larger values about the relative dielectric constant ($\epsilon r$) and the maximum amount of polarization (P) were obtained. In other words, piezoelectric properties can be improved as long as the sodium bismuth titanate as the first compound and $BiMeO_3$ as the second compound can be contained or the solid solutions thereof can be contained.

In the Examples above, for manganese, iron, chromium and the like, which could get the same valence other than the compositions of sodium bismuth titanate and cobalt bismuth oxide, the similar effect could be obtained.

The embodiments and examples above are exemplified to illustrate the present invention. Thus, the present invention is not limited to these embodiments and examples. Further, in the embodiments and examples above, there only have the description on the situation comprising the first compound and the second compound, but in addition to these, other compounds can also be comprised.

INDUSTRIAL APPLICATION

The piezoelectric composition of the present invention can be widely used in fields such as the actuators, sensors, resonators and the like.

What is claimed:

1. A piezoelectric composition, comprising a two component-based solid solution represented by Formula (1):

$$(1-x)(Bi_{0.5}Na_{0.5})TiO_3 - xBiMeO_3 \quad (1)$$

wherein $0.27 \leq x \leq 0.43$; and

Me is at least one element selected from the group consisting of Mn, Cr, Fe, and Co.

2. A piezoelectric element comprising the piezoelectric composition of claim 1.

* * * * *